United States Patent [19]
Gat et al.

[11] Patent Number: 5,960,158
[45] Date of Patent: Sep. 28, 1999

[54] APPARATUS AND METHOD FOR FILTERING LIGHT IN A THERMAL PROCESSING CHAMBER

[75] Inventors: Arnon Gat, Palo Alto; Robert J. Champetier, Scotts Valley, both of Calif.; Ram Z. Fabian, Haifa, Israel

[73] Assignee: AG Associates, San Jose, Calif.

[21] Appl. No.: 08/893,699

[22] Filed: Jul. 11, 1997

[51] Int. Cl.⁶ .................. G01J 5/06; F27B 5/14; F27B 5/18
[52] U.S. Cl. .............. 392/416; 219/390; 219/405; 374/126
[58] Field of Search .................. 219/405, 411, 219/390; 118/50.1, 724, 725; 392/411, 416; 250/492.2, 503.1, 504 R; 374/123, 126, 127, 133

[56] References Cited

U.S. PATENT DOCUMENTS

| | | |
|---|---|---|
| 2,057,776 | 10/1936 | Groven . |
| 2,318,533 | 5/1943 | Selvig . |
| 3,331,941 | 7/1967 | Edwards et al. . |
| 3,523,179 | 8/1970 | Edwards et al. . |
| 3,623,712 | 11/1971 | McNeilly et al. . |
| 3,761,678 | 9/1973 | Eckles . |

(List continued on next page.)

FOREIGN PATENT DOCUMENTS

| | | |
|---|---|---|
| 0308388A1 | 3/1989 | European Pat. Off. . |
| 0468874A2 | 1/1992 | European Pat. Off. . |
| 58-24788 | 2/1983 | Japan . |
| 59-17253 | 1/1984 | Japan . |
| 60-727 | 1/1985 | Japan . |
| 60-253939 | 12/1985 | Japan . |
| 60-258915 | 12/1985 | Japan . |
| 60-258928 | 12/1985 | Japan . |
| 61-196515 | 8/1986 | Japan . |
| 61-199631 | 9/1986 | Japan . |
| 62-20308 | 1/1987 | Japan . |
| 62-33418 | 2/1987 | Japan . |
| 62-46516 | 2/1987 | Japan . |
| 63-39930 | 3/1988 | Japan . |
| 63-143814 | 6/1988 | Japan . |
| 63-149524 | 10/1988 | Japan . |
| 63-260127 | 10/1988 | Japan . |
| 63-263719 | 10/1988 | Japan . |
| 63-269515 | 11/1988 | Japan . |
| 64-11324 | 1/1989 | Japan . |
| 64-90525 | 4/1989 | Japan . |
| 1-204114 | 8/1989 | Japan . |
| 1-239428 | 9/1989 | Japan . |
| 2180989 | 5/1989 | United Kingdom . |

OTHER PUBLICATIONS

"The Wafer Temperature Measurement in Dual OH–Band Quartz Tube"; H. Walk, T. Theiler; Ulm, Germany; 1994.

*Primary Examiner*—Jospeh Pelham
*Attorney, Agent, or Firm*—Dority & Manning, P.A.

[57] ABSTRACT

The present invention is directed to an apparatus and process for filtering light in a thermal processing chamber. In particular, the apparatus of the present invention includes a first spectral filter spaced apart from a second spectral filter. The first spectral filter is spaced apart from the second spectral filter so as to define a cooling fluid channel therebetween through which a cooling fluid can be circulated. In order to prevent thermal radiation being emitted by the light source from interfering with the operation of a radiation sensing device contained in the chamber, the first spectral filter absorbs most of the thermal radiation being emitted by the light source at the operating wavelength of the radiation sensing device. The second spectral filter, on the other hand, is substantially transparent to thermal radiation at the operating wavelength of the radiation sensing device. If desired, various reflective coatings made from dielectric materials can also be applied to selected surfaces of the spectral filters to further prevent unwanted thermal radiation from being detected by the radiation sensing device and for preventing the spectral filters from increasing in temperature during operation of the chamber.

30 Claims, 3 Drawing Sheets

U.S. PATENT DOCUMENTS

| | | |
|---|---|---|
| 3,796,182 | 3/1974 | Rosler . |
| 3,830,194 | 8/1974 | Benzing et al. . |
| 3,836,751 | 9/1974 | Anderson . |
| 3,862,397 | 1/1975 | Anderson et al. . |
| 3,936,686 | 2/1976 | Moore . |
| 4,001,047 | 1/1977 | Boah . |
| 4,041,278 | 8/1977 | Boah . |
| 4,047,496 | 9/1977 | McNeilly et al. . |
| 4,048,955 | 9/1977 | Anderson . |
| 4,081,313 | 3/1978 | McNeilly et al. . |
| 4,097,226 | 6/1978 | Erikson et al. . |
| 4,101,759 | 7/1978 | Anthony et al. . |
| 4,115,163 | 9/1978 | Gorina et al. . |
| 4,184,065 | 1/1980 | Nagashima . |
| 4,221,956 | 9/1980 | Fielding et al. . |
| 4,224,504 | 9/1980 | Erikson et al. . |
| 4,232,360 | 11/1980 | Vakil et al. . |
| 4,263,500 | 4/1981 | Springer et al. . |
| 4,270,260 | 6/1981 | Krueger . |
| 4,378,956 | 4/1983 | Lester . |
| 4,389,970 | 6/1983 | Edgerton . |
| 4,411,619 | 10/1983 | Darnell et al. . |
| 4,436,985 | 3/1984 | Weber . |
| 4,442,338 | 4/1984 | Yamazaki . |
| 4,446,817 | 5/1984 | Crawley . |
| 4,448,000 | 5/1984 | Manuccia et al. . |
| 4,470,369 | 9/1984 | Edgerton . |
| 4,477,718 | 10/1984 | Crain et al. . |
| 4,489,234 | 12/1984 | Harnden, Jr. et al. . |
| 4,496,828 | 1/1985 | Kusmierz et al. . |
| 4,504,323 | 3/1985 | Arai et al. . |
| 4,504,730 | 3/1985 | Shimizu . |
| 4,508,960 | 4/1985 | Arai . |
| 4,510,555 | 4/1985 | Mori . |
| 4,511,788 | 4/1985 | Arai et al. . |
| 4,517,448 | 5/1985 | Crain et al. . |
| 4,533,820 | 8/1985 | Shimizu . |
| 4,540,876 | 9/1985 | McGinty . |
| 4,543,472 | 9/1985 | Arai et al. . |
| 4,544,418 | 10/1985 | Gibbons . |
| 4,545,327 | 10/1985 | Campbell et al. . |
| 4,550,245 | 10/1985 | Arai et al. . |
| 4,550,684 | 11/1985 | Mahawili . |
| 4,551,616 | 11/1985 | Buttery . |
| 4,558,660 | 12/1985 | Nishizawa et al. . |
| 4,567,352 | 1/1986 | Mimura et al. . |
| 4,571,486 | 2/1986 | Arai et al. . |
| 4,581,520 | 4/1986 | Vu et al. . |
| 4,607,591 | 8/1986 | Stitz . |
| 4,615,294 | 10/1986 | Scapple et al. . |
| 4,632,056 | 12/1986 | Stitz et al. . |
| 4,632,057 | 12/1986 | Price et al. . |
| 4,640,224 | 2/1987 | Bunch et al. . |
| 4,642,243 | 2/1987 | Yamazaki . |
| 4,649,261 | 3/1987 | Sheets . |
| 4,653,428 | 3/1987 | Wilson et al. . |
| 4,654,509 | 3/1987 | Robinson et al. . |
| 4,680,447 | 7/1987 | Mahawili . |
| 4,680,451 | 7/1987 | Gat et al. . |
| 4,694,143 | 9/1987 | Nishimura et al. . |
| 4,698,486 | 10/1987 | Sheets . |
| 4,755,654 | 7/1988 | Crowley et al. . |
| 4,761,538 | 8/1988 | Chiba et al. . |
| 4,789,771 | 12/1988 | Robinson et al. . |
| 4,796,562 | 1/1989 | Brors et al. . |
| 4,802,441 | 2/1989 | Waugh . |
| 4,806,321 | 2/1989 | Nishizawa et al. . |
| 4,817,558 | 4/1989 | Itoh . |
| 4,820,377 | 4/1989 | Davis et al. . |
| 4,820,906 | 4/1989 | Stultz . |
| 4,830,700 | 5/1989 | Davis et al. . |
| 4,832,777 | 5/1989 | Davis et al. . |
| 4,832,778 | 5/1989 | Davis et al. . |
| 4,832,779 | 5/1989 | Fisher et al. . |
| 4,836,138 | 6/1989 | Robinson et al. . |
| 4,854,263 | 8/1989 | Chang et al. . |
| 4,857,139 | 8/1989 | Tashiro et al. . |
| 4,857,704 | 8/1989 | Jannot et al. . |
| 4,859,832 | 8/1989 | Uehara et al. . |
| 4,886,954 | 12/1989 | Yu et al. . |
| 4,901,670 | 2/1990 | Ahlgren . |
| 4,908,495 | 3/1990 | Ishii et al. . |
| 4,911,103 | 3/1990 | Davis et al. . |
| 4,913,929 | 4/1990 | Moslehi et al. . |
| 4,914,276 | 4/1990 | Blair . |
| 4,919,077 | 4/1990 | Oda et al. . |
| 4,920,918 | 5/1990 | Adams et al. . |
| 4,924,073 | 5/1990 | Chiba . |
| 4,924,807 | 5/1990 | Nakayama et al. . |
| 4,956,538 | 9/1990 | Moslehi ................................. 219/405 |
| 4,958,061 | 9/1990 | Wakabayashi et al. . |
| 4,975,561 | 12/1990 | Robinson et al. . |
| 4,979,466 | 12/1990 | Nishitani et al. . |
| 4,981,815 | 1/1991 | Kakoschke . |
| 4,985,281 | 1/1991 | Ahlgren . |
| 4,989,544 | 2/1991 | Yoshikawa . |
| 5,000,113 | 3/1991 | Wang et al. . |
| 5,011,794 | 4/1991 | Grim et al. . |
| 5,033,407 | 7/1991 | Mizuno et al. . |
| 5,038,395 | 8/1991 | Lenski . |
| 5,044,943 | 9/1991 | Bowman et al. . |
| 5,047,611 | 9/1991 | Stultz . |
| 5,053,247 | 10/1991 | Moore . |
| 5,057,668 | 10/1991 | Gisdakis et al. . |
| 5,073,698 | 12/1991 | Stultz . |
| 5,085,887 | 2/1992 | Adams et al. . |
| 5,108,792 | 4/1992 | Anderson et al. . |
| 5,113,929 | 5/1992 | Nakagawa et al. . |
| 5,129,360 | 7/1992 | Ahern et al. . |
| 5,145,716 | 9/1992 | Paserin et al. . |
| 5,148,714 | 9/1992 | Mcdiarmid . |
| 5,154,512 | 10/1992 | Schietinger et al. . |
| 5,155,337 | 10/1992 | Sorrell et al. . |
| 5,156,820 | 10/1992 | Wong et al. . |
| 5,160,545 | 11/1992 | Maloney et al. . |
| 5,179,677 | 1/1993 | Anderson et al. . |
| 5,188,058 | 2/1993 | Nakai . |
| 5,194,401 | 3/1993 | Adams et al. . |
| 5,196,667 | 3/1993 | Gammelin . |
| 5,207,835 | 5/1993 | Moore . |
| 5,215,588 | 6/1993 | Rhieu . |
| 5,226,732 | 7/1993 | Nakos et al. . |
| 5,244,501 | 9/1993 | Nakayama et al. . |
| 5,252,132 | 10/1993 | Oda et al. . |
| 5,252,366 | 10/1993 | Ahern et al. . |
| 5,259,881 | 11/1993 | Edwards et al. . |
| 5,268,989 | 12/1993 | Moslehi et al. . |
| 5,269,847 | 12/1993 | Anderson et al. . |
| 5,271,084 | 12/1993 | Vandenabeele et al. . |
| 5,275,629 | 1/1994 | Ajika et al. . |
| 5,288,364 | 2/1994 | Burt et al. . |
| 5,305,417 | 4/1994 | Najm et al. . |
| 5,308,161 | 5/1994 | Stein . |
| 5,314,538 | 5/1994 | Maeda et al. . |
| 5,314,541 | 5/1994 | Saito et al. . |
| 5,315,092 | 5/1994 | Takahashi et al. . |
| 5,317,492 | 5/1994 | Gronet et al. . |
| 5,322,567 | 6/1994 | Deaton et al. . |
| 5,332,442 | 7/1994 | Kubodera et al. . |
| 5,332,883 | 7/1994 | Higashira . |
| 5,345,534 | 9/1994 | Najm et al. . |
| 5,348,587 | 9/1994 | Eichman et al. . |

| | | | | | |
|---|---|---|---|---|---|
| 5,364,667 | 11/1994 | Rhieu . | 5,525,160 | 6/1996 | Tanaka et al. . |
| 5,366,554 | 11/1994 | Kanai et al. . | 5,532,457 | 7/1996 | Cobb et al. . |
| 5,367,606 | 11/1994 | Moslehi et al. . | 5,534,072 | 7/1996 | Mizuno et al. . |
| 5,372,648 | 12/1994 | Yamomoto et al. . | 5,539,855 | 7/1996 | Takahashi et al. . |
| 5,380,682 | 1/1995 | Edwards et al. . | 5,551,982 | 9/1996 | Anderson et al. . |
| 5,414,244 | 5/1995 | Imahashi . | 5,551,985 | 9/1996 | Brors et al. . |
| 5,418,885 | 5/1995 | Hauser et al. . | 5,561,735 | 10/1996 | Camm . |
| 5,444,217 | 8/1995 | Moore et al. . | 5,565,382 | 10/1996 | Tseng et al. . |
| 5,444,815 | 8/1995 | Lee et al. . | 5,571,749 | 11/1996 | Matsuda et al. . |
| 5,445,675 | 8/1995 | Kubodera et al. . | 5,576,059 | 11/1996 | Beinglass et al. . |
| 5,446,824 | 8/1995 | Moslehi . | 5,577,157 | 11/1996 | Sopori . |
| 5,446,825 | 8/1995 | Moslehi et al. . | 5,580,830 | 12/1996 | Nenyei et al. . |
| 5,449,883 | 9/1995 | Tsuruta . | 5,587,019 | 12/1996 | Fujie . |
| 5,451,260 | 9/1995 | Versteeg et al. . | 5,595,606 | 1/1997 | Fujikawa et al. . |
| 5,452,396 | 9/1995 | Sopori . | 5,599,397 | 2/1997 | Anderson et al. . |
| 5,478,609 | 12/1995 | Okamura . | 5,609,689 | 3/1997 | Kato et al. . |
| 5,480,489 | 1/1996 | Hasegawa . | 5,611,898 | 3/1997 | Guhman et al. . |
| 5,481,088 | 1/1996 | Peck et al. . | 5,624,499 | 4/1997 | Mizuno et al. . |
| 5,482,557 | 1/1996 | Kanai et al. . | 5,624,590 | 4/1997 | Fiory . |
| 5,487,127 | 1/1996 | Gronet et al. . | 5,635,409 | 6/1997 | Moslehi . |
| 5,493,987 | 2/1996 | McDiarmid et al. . | 5,683,173 | 11/1997 | Gronet et al. . |
| 5,501,739 | 3/1996 | Yamada et al. . | 5,689,614 | 11/1997 | Gronet et al. . |
| 5,504,831 | 4/1996 | Sandhu et al. . | 5,738,440 | 4/1998 | O'Neill et al. .......................... 374/126 |
| 5,505,779 | 4/1996 | Mizuno et al. . | 5,755,511 | 5/1998 | Peuse et al. ............................ 374/126 |
| 5,518,549 | 5/1996 | Hellwig . | | | |

APPARATUS AND METHOD FOR FILTERING LIGHT IN A THERMAL PROCESSING CHAMBER

FIELD OF THE INVENTION

The present invention is generally directed to a method and apparatus for heat treating semiconductor wafers in a thermal processing chamber using light energy. More particularly, the present invention is directed to an apparatus and method for filtering light in a thermal processing chamber for more accurately heat treating a semiconductor wafer within the chamber.

BACKGROUND OF THE INVENTION

A thermal processing chamber, as used herein, refers to a device that uses light energy to heat objects, such as semiconductor wafers. Such devices typically include a substrate holder for holding a semiconductor wafer and a light source that emits light energy for heating the wafer. For monitoring the temperature of the semiconductor wafer during heat treatment, thermal processing chambers also typically include radiation sensing devices, such as pyrometers, that sense the radiation being emitted by the semiconductor wafer at a selected wavelength. By sensing the thermal radiation being emitted by the wafer, the temperature of the wafer can be calculated with reasonable accuracy.

One major problem in the design of rapid thermal processing chambers having an optical temperature measurement system, however, has been the ability to prevent unwanted light radiated by the heater lamps from being detected by the pyrometric instrumentation. Should unwanted light not being emitted by the semiconductor wafer be detected by the pyrometer, the calculated temperature of the wafer may unreasonably deviate from the actual or true temperature of the wafer.

In the past, various methods have been used to prevent unwanted thermal radiation from being detected by the pyrometer. For instance, physical barriers have been used before to isolate and prevent unwanted light being emitted by the heater lamps from coming into contact with the pyrometer. Physical barriers have been especially used in rapid thermal processing chambers in which the heater lamps are positioned on one side of the semiconductor wafer and the pyrometer is positioned on the opposite side of the wafer.

Besides physical barriers, spectral filters have also been used to limit the amount of light interference detected by the pyrometers. A spectral filter refers to a device that filters the light being emitted by the heater lamps prior to the light entering the rapid thermal processing chamber. For instance, spectral filters can operate by removing light being emitted by the heater lamps at the wavelength at which the pyrometer operates. Preferably, spectral filters absorb unwanted thermal radiation while at the same time being transparent to the thermal radiation being emitted by the heater lamps that is necessary to heat the semiconductor wafer.

One type of spectral filter that has been used in the past by the assignee of the present invention is a window made from fused silica. Fused silica glass is transparent to most light energy but is known to have several strong absorbing regions that are maximized at wavelengths of about 2.7 microns, 4.5 microns and at wavelengths equal to and greater than 5 microns. The light absorbing bands at 4.5 microns and at 5 microns and greater are typically common and present in most grades of silica. The light absorbing band at 2.7 microns, however, is caused by the presence of "water" in the form of hydroxide ions contained within the particular type of silica. Specifically, when it is desirable to filter light at a wavelength of 2.7 microns using silica, the silica should contain hydroxide ions in a concentration of at least about 0.1% by weight.

Because silica glass can effectively absorb light at wavelengths of 2.7, 4.5 and greater than 5 microns and is substantially transparent to all other wavelengths of light energy, silica glass makes an effective spectral filter when the pyrometer contained within the thermal processing chamber is configured to sense thermal radiation at one of the above wavelengths.

Although spectral filters can be very efficient in filtering unwanted light emitted by heater lamps in a rapid thermal processing chamber, the spectral filters can increase in temperature during operation of the chamber and interfere with the heat treating wafer process. For instance, it is possible for spectral filters to gradually heat up due to the absorption of light being emitted by the heater lamps and, more particularly, due to absorbing thermal radiation being emitted by the hot semiconductor wafer. When a spectral filter substantially increases in temperature, the spectral filter can adversely interfere with the ability of the thermal processing chamber to uniformly heat subsequent semiconductor wafers.

Most thermal processing chambers process semiconductor wafers one at a time. Ideally, it is highly desirable to exchange and process wafers at a high rate of speed. When doing so, problems occur when a spectral filter is not allowed sufficient time to cool down to lower temperatures when loading a new semiconductor wafer into the chamber. Thus, a need exists for an apparatus and process for keeping a spectral filter from substantially increasing in temperature during the operation of a thermal processing chamber.

In the past, it has been proposed to use cooling fluids in order to cool spectral filters during operation of a rapid thermal processing chamber. For instance, in U.S. Pat. Nos. 4,550,684 and 4,680,477 both to Mahawili, a cooled optical window for semiconductor wafer heating is disclosed. Specifically, both of the above patents disclose using two parallel plates positioned within a thermal processing chamber. In order to prevent the plates from heating up, a fluid, such as water, air or the like, is circulated between the plates.

Even though the prior art has proposed various configurations, however, further improvements in the ability to prevent the heater lamps and spectral filters from interfering with the heat treating process are needed. As speed and product specifications become more demanding, the ability to heat treat semiconductor wafers according to specific temperature regimes and to precisely monitor the temperature of the wafer are becoming extremely crucial. In this regard, the present invention is directed to further improvements in thermal processing chambers for heat treating semiconductor wafers. As will be made apparent from the following description, various features, aspects, and advantages of the present invention remain absent from the prior art.

SUMMARY OF THE INVENTION

The present invention recognizes and addresses the foregoing disadvantages, and others of prior art constructions and methods.

Accordingly, it is an object of the present invention to provide an improved apparatus and process for heat treating objects, such as semiconductor wafers.

Another object of the present invention is to provide an apparatus and method for filtering light in a thermal processing chamber.

It is another object of the present invention to provide a method and apparatus for filtering light in a thermal processing chamber for more accurately sensing thermal radiation being emitted by a wafer within the chamber.

Still another object of the present invention is to provide a thermal processing apparatus that includes a first filter window spaced apart from a second filter window so as to define a cooling channel therebetween.

Another object of the present invention is to provide a thermal processing apparatus having two spaced apart filter windows in which one of the windows closest to a light source is well adapted to filtering light at a particular wavelength while the remaining window is substantially transparent to light at the same wavelength.

Another object of the present invention is to provide a thermal processing apparatus that includes at least one spectral filter that is coated on at least one of its surfaces with a reflective coating.

Still another object of the present invention is to provide a method for filtering light in a rapid thermal processing chamber using dielectric coatings on at least one spectral filter for reflecting light at a particular wavelength.

These and other objects of the present invention are achieved by providing an apparatus for heat treating semiconductor devices. The apparatus includes a thermal processing chamber adapted to contain a semiconductor wafer. A light source including at least one lamp is used to emit light energy into the chamber. At least one radiation sensing device is located within the thermal processing chamber and is configured to sense thermal radiation at a preselected wavelength being emitted by a semiconductor wafer being heat treated.

In accordance with the present invention, the apparatus further includes a first spectral filter positioned between the light source and the radiation sensing device. The first spectral filter is configured to absorb thermal radiation being emitted by the light source at the preselected wavelength at which the radiation sensing device operates.

A second spectral filter is spaced apart from the first spectral filter so as to define a cooling channel therebetween. The second spectral filter is positioned between the first spectral filter and the radiation sensing device. The second spectral filter is substantially transparent to thermal radiation at the preselected wavelength.

In this configuration, the second spectral filter is not only prevented from substantially increasing in temperature during operation of the thermal processing chamber but also does not emit unwanted thermal radiation that may be detected by the radiation sensing device.

In one embodiment, when the radiation sensing device is configured to detect thermal radiation at a wavelength of about 2.7 microns, the first spectral filter is made from silica and contains a hydroxide concentration of at least 0.1% by weight. The second spectral filter, on the other hand, is substantially transparent to light energy at a wavelength of 2.7 microns. The second spectral filter can be made of, for instance, sapphire or silica containing less than 10 ppm of hydroxide ions.

The apparatus can further include a cooling fluid conveying device for forcing a cooling fluid through the cooling channel defined by the first and second spectral filters. For instance, the cooling fluid conveying device can be used to force a gas or a liquid through the channel. In one embodiment, the cooling fluid can be air which is forced through the cooling fluid channel at a rate of at least 150 cubic feet per minute, and particularly at a rate of at least 200 cubic feet per minute.

The apparatus of the present invention can also include a first reflective coating applied to a surface of the second spectral filter that is facing a semiconductor wafer contained in the chamber. The first reflective coating can be designed to reflect thermal radiation being emitted by the semiconductor wafer at a wavelength of greater than about 4 microns for further preventing the second spectral filter from increasing in temperature when the wafer is heated. The coating, for instance, can be made from multiple layers of dielectric materials.

In addition to or used without the first reflective coating, the apparatus can also include a second reflective coating that is applied to a surface of the first spectral filter that is facing the second spectral filter. The second reflective coating can be designed to prevent thermal radiation at a wavelength of about 2.7 microns from being emitted by the first spectral filter towards the radiation sensing device. Similar to the first reflective coating, the second reflective coating can also be made from dielectric materials.

These and other objects of the present invention are also achieved by providing an apparatus for heat treating semiconductor devices that includes a thermal processing chamber in communication with a light source. The light source emits light energy into the processing chamber for heat treating semiconductor wafers. At least one radiation sensing device is located within the chamber for sensing thermal radiation being emitted by a wafer at a preselected wavelength. A spectral filter is positioned between the light source and the radiation sensing device. The spectral filter is configured to substantially prevent thermal radiation being emitted by the light source at the wavelength in which the radiation sensing device operates from being detected by the radiation sensing device.

In accordance with the present invention, the spectral filter includes a first outer surface facing the radiation sensing device. The first outer surface is coated with a reflective coating that is configured to reflect thermal radiation at a wavelength of greater than about 4 microns being emitted by a semiconductor wafer contained in the chamber. The reflective coating is for preventing the spectral filter from absorbing the thermal radiation and increasing in temperature.

In one embodiment, the spectral filter can include a first filter window spaced apart from a second filter window so as to define a cooling channel therebetween. The first and second filter windows can be positioned so that light energy being emitted by the light source first passes through the first filter window and then through the second filter window. The first filter window can include a second reflective coating applied to a first inner surface facing the second filter window. The second reflective coating can be made from a dielectric material and can be configured to prevent thermal radiation at the operating wavelength of the radiation sensing device from being emitted by the first filter window.

A third reflective coating can be applied to the first filter window on a surface facing the light source, while a fourth reflective coating can be applied to the second filter window on a surface facing the first filter window. The third and fourth reflective coatings can be designed to reflect thermal radiation at a wavelength of greater than about 4 microns to prevent each of the windows from increasing in temperature due to thermal radiation present within the processing chamber.

It should be appreciated that although the reflective coatings have been described to work in combination with the use of two filter windows, each of the coatings can also be used alone in thermal processing chambers containing only a single filter window. For instance, in a further alternative embodiment of the present invention, a thermal processing chamber contains a spectral filter placed between a light source and a radiation sensing device. A reflective coating is applied to a surface of the spectral filter facing the radiation sensing device. The reflective coating can be designed to prevent thermal radiation at the wavelength at which the radiation sensing device operates from being emitted by the spectral filter during operation of the thermal processing chamber.

Other objects, features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Figure 1:
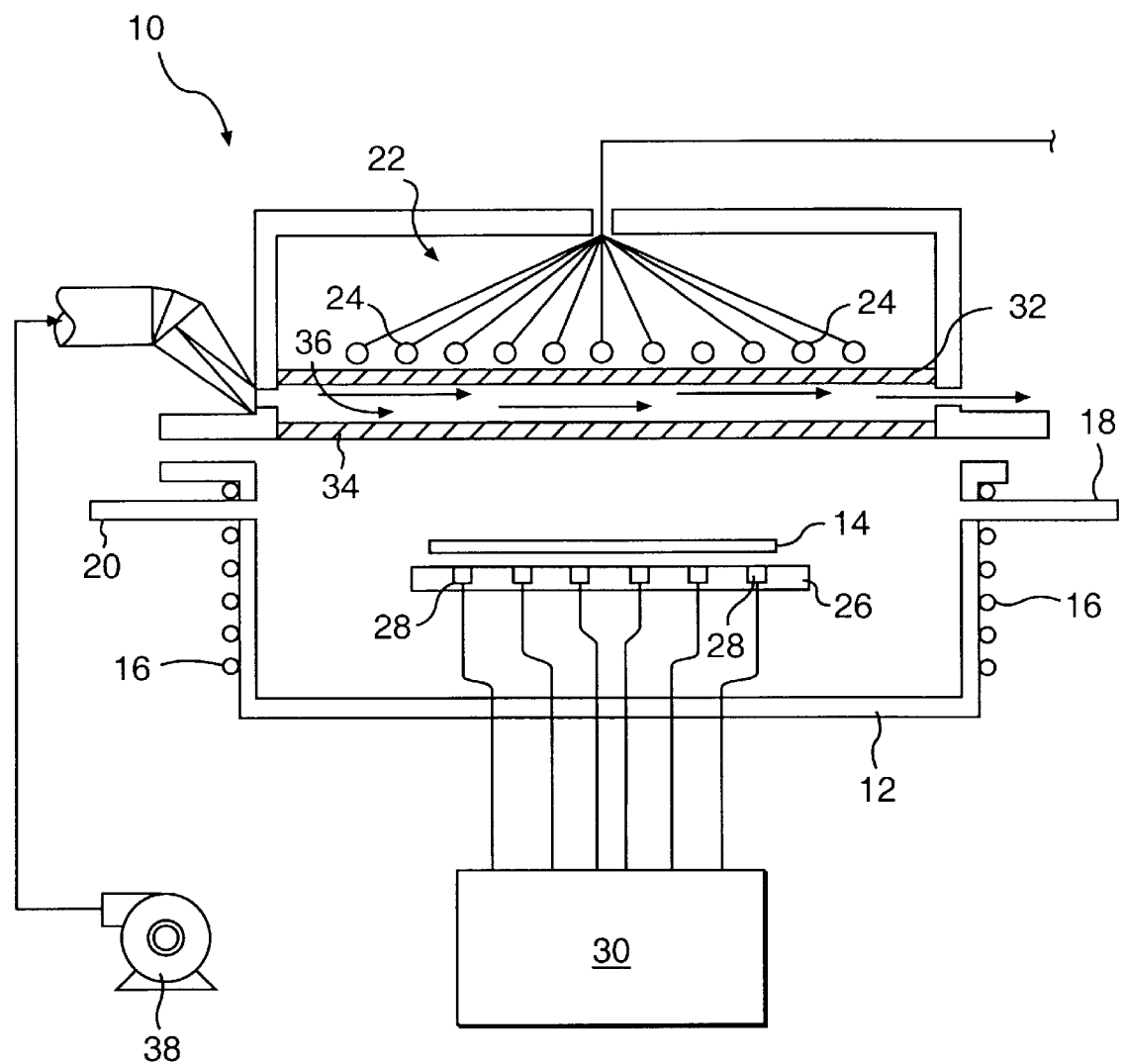
FIG. 1 is a side view of one embodiment of an apparatus for heat treating semiconductor devices in accordance with the present invention.

Repeat use of reference characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention which broader aspects are embodied in the exemplary construction.

In general, the present invention is directed to an apparatus and method for heating semiconductor wafers while accurately monitoring the temperature of the wafer. The apparatus includes a thermal processing chamber in communication with a light source that is used to heat treat semiconductor wafers contained in the chamber. A radiation sensing device, such as a pyrometer, extends into the chamber and is positioned to sense thermal radiation at a particular wavelength being emitted by a semiconductor wafer. By sensing the thermal radiation being emitted by the wafer at a particular wavelength, the pyrometer can be used to calculate the temperature of the wafer during operation of the thermal processing chamber.

In one embodiment of the present invention, the apparatus further includes a first spectral filter spaced apart from a second spectral filter. Both spectral filters are positioned between the light source and the radiation sensing device in a manner such that light being emitted from the light source first passes through the first spectral filter and then through the second spectral filter. The first spectral filter is spaced apart from the second spectral filter in a manner such that a cooling channel is defined therebetween. In this regard, the apparatus can further include a cooling fluid conveying device which forces a cooling fluid, such as a gas or a liquid, between the spectral filters. The cooling fluid thus cools each of the spectral filters during operation of the thermal processing chamber.

The first spectral filter and the second spectral filter are substantially transparent to light energy being emitted by the light source that is needed for heating a semiconductor wafer in the chamber. The first spectral filter, however, substantially absorbs most of the light energy being emitted by the light source at the wavelength at which the radiation sensing device operates. The second spectral filter, on the other hand, is substantially transparent at the operating wavelength of the radiation sensing device.

In this arrangement, substantially all of the light energy being emitted by the light source at the operating wavelength of the radiation sensing device is prevented from being detected by the radiation sensing device. Also, during operation of the chamber, the cooling fluid cools each of the spectral filters and prevents them from heating up and interfering with the heat treatment process of the wafer in the chamber or of a subsequent wafer. Further, because the second spectral filter is substantially transparent to light energy at the operating wavelength of the radiation sensing device, the second spectral filter will not emit thermal radiation that may be detected by the radiation sensing device.

In an alternative embodiment, the present invention is also directed to thermal processing chambers containing one or more spectral filters positioned between a light source and a radiation sensing device. In accordance with the present invention, the spectral filter or filters included with the apparatus contain one or more light reflective coatings used either to enhance the ability of the spectral filters to prevent unwanted thermal radiation from being detected by the radiation sensing device or to prevent the spectral filters from increasing in temperatures that will adversely effect operation of the chamber.

Referring to FIG. 1, an apparatus generally 10 made in accordance with one embodiment of the present invention for heat treating semiconductor devices, such as silicon wafers, is shown. Apparatus 10 includes a processing chamber 12 adapted to receive substrates such as a semiconductor wafer 14 for conducting various processes. Chamber 12 is designed to heat wafer 14 at very rapid rates and under very carefully controlled conditions. Chamber 12 can be made from various materials, including metals and ceramics. For instance, chamber 12, in one embodiment, can be made from stainless steel.

When chamber 12 is made from a heat conductive material, preferably the chamber includes a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a constant temperature.

Chamber 12 can also include a gas inlet 18 and a gas outlet 20 for introducing a gas into the chamber and/or for maintaining the chamber within a preset pressure range. For instance, a gas can be introduced into chamber 12 through gas inlet 18 for reaction with wafer 14. Once processed, the gas can then be evacuated from the chamber using gas outlet 20.

Alternatively, an inert gas can be fed to chamber 12 through gas inlet 18 for preventing any unwanted or undesirable side reactions from occurring within the chamber. In a further embodiment, gas inlet 18 and gas outlet 20 can be used to pressurize chamber 12. A vacuum can also be created in chamber 12 when desired, using gas outlet 20 or an additional larger outlet positioned beneath the level of the wafer.

During processing, chamber 12, in one embodiment, can be adapted to rotate wafer 14. Rotating the wafer promotes greater temperature uniformity over the surface of the wafer and promotes enhanced contact between wafer 14 and any gases introduced into the chamber. It should be understood, however, that besides wafers, chamber 12 is also adapted to process optical parts, films, fibers, ribbons and other substrates having any particular shape.

A light source generally 22 is included in communication with chamber 12 for emitting light energy and heating wafer 14 during processing. In this embodiment, light source 22 includes a plurality of lamps 24. Lamps 24 can be incandescent lamps, such as tungsten-halogen lamps. Light source 22 can include a reflector or a set of reflectors for carefully directing light energy being emitted by lamps 24 uniformly onto wafer 14. As shown in FIG. 1, lamps 24 are placed above wafer 14. It should be understood, however, that lamps 24 may be placed at any particular location. Further, additional or less lamps could be included within apparatus 10 as desired.

In thermal processing apparatuses, the use of lamps 24 as a heat source is generally preferred. For instance, lamps have much higher heating and cooling rates than other heating devices, such as electrical elements or conventional furnaces. Lamps 24 create a rapid thermal processing system that provides instantaneous energy, typically requiring a very short and well controlled start up period. The flow of energy from lamps 24 can also be abruptly stopped at any time. The lamps can be equipped with gradual power controls and can be connected to a controller that automatically adjusts the amount of light energy being emitted by the lamps based on temperature measurements of the wafer.

Semiconductor wafer 14 is supported within thermal processing chamber 12 by a substrate holder 26. Substrate holder 26, in this embodiment, also supports a plurality of optical fibers or light pipes 28 which are, in turn, in communication with a radiation sensing device 30, such as a pyrometer. Alternatively to the embodiment illustrated in FIG. 1, each optical fiber 28 can be connected to a separate radiation sensing device if desired.

Optical fibers 28 are configured to receive thermal radiation being emitted by wafer 14 at a particular wavelength. The amount of sensed radiation is then communicated to radiation sensing device 30 which generates a usable voltage signal for determining the temperature of the wafer.

During the processing of semiconductor wafer 14, apparatus 10 is designed such that optical fibers 28 only detect thermal radiation being emitted by the wafer and do not detect substantial amounts of radiation being emitted by lamps 24. In this regard, apparatus 10 includes a first spectral filter 32 spaced apart from a second spectral filter 34. In general, spectral filters 32 and 34, which are positioned between light source 22 and radiation sensing device 30, substantially prevent thermal radiation being emitted by lamps 24 at the wavelength at which radiation sensing device 30 operates from entering chamber 12.

As described above, although spectral filters 32 and 34 are necessary to filter light being emitted by light source 22, the spectral filters themselves may heat up during operation of the chamber. Specifically, the spectral filters are heated by thermal radiation being emitted not only by light source 22 but mostly from the hot wafer 14. One object of the present invention is to minimize the heating of the spectral filters during operation of the chamber so as to limit the back radiation of heat towards subsequent wafers that are processed in the chamber. By preventing the spectral filters from substantially increasing in temperature, the present invention provides an apparatus with improved temperature control of the wafers being heat treated.

In this regard, as shown in FIG. 1, first spectral filter 32 is spaced apart from second spectral filter 34 in a manner such that a cooling fluid channel 36 is defined therebetween. Cooling fluid channel 36 is designed to allow a cooling fluid, such as a gas or a liquid, to circulate between the filters.

For instance, apparatus 10 includes a cooling fluid conveying device 38 which forces a cooling fluid through channel 36. In one embodiment, cooling fluid conveying device 38 can be a blower for forcing a gas, such as air through the cooling fluid channel. When using air as a cooling fluid, the air can be pumped through the cooling fluid channel at a rate of at least about 150 cubic feet per minute. More particularly, air can be forced through the channel at a rate of at least about 200 cubic feet per minute which has been found to adequately cool spectral filters 32 and 34.

Of course, besides air, various other liquids and gases can be used as cooling fluids in the apparatus of the present invention. The cooling fluid chosen, however, should not interfere with the transmission of light into thermal processing chamber 12.

Besides circulating a cooling fluid between the spectral filters, the spectral filters themselves in the apparatus of the present invention are also designed to work in tandem without allowing the spectral filter closest to the wafer from substantially increasing in temperature. In particular, first spectral filter 32 is designed to substantially absorb most of the thermal radiation being emitted by light source 22 at the wavelength at which radiation sensing device 30 operates. Second spectral filter 34, on the other hand, according to the present invention, is substantially transparent to thermal radiation at the same wavelength.

In this manner, the first spectral filter prevents unwanted thermal radiation being emitted by light source 22 from being detected by radiation sensing device 30. Meanwhile, second spectral filter 36, since it is transparent at the same wavelength, will not emit thermal radiation at this wavelength even if the spectral filter increases in temperature.

One embodiment of the present invention will now be discussed in detail. In particular, the following embodiment will be directed to the use of spectral filters specifically designed for use in conjunction with a radiation sensing device that operates at a wavelength of about 2.7 microns. It should be understood, however, that in other embodiments, other types of spectral filters may be used for operating at different wavelengths.

When radiation sensing device 30 is configured to detect thermal radiation at a wavelength of about 2.7 microns, in accordance with the present invention as described above, first spectral filter 32 should be designed to substantially absorb most thermal radiation being emitted by light source 22 at the operating wavelength. For example, in one preferred embodiment, first spectral filter 32 is made from silica glass, such as synthetic silica or fused quartz, having a hydroxide ion concentration of at least about 0.1% by weight. By having a hydroxide concentration of at least 0.1%, the silica glass is very effective at absorbing thermal radiation at a wavelength of 2.7 microns.

Second spectral filter 34, on the other hand, should be substantially transparent to thermal radiation at a wavelength of 2.7 microns. By being substantially transparent to thermal radiation at a wavelength of 2.7 microns, second spectral filter 34 will not emit thermal radiation at this wavelength. In particular, if second spectral filter 34 were not transparent to thermal radiation at a wavelength of 2.7 microns, once the spectral filter heats up, the filter may emit thermal radiation at any wavelength at which the filter is not transparent.

Preferably, second spectral filter 34 should also be transparent to most thermal radiation at any wavelength being emitted by wafer 14 in order to keep spectral filter 34 from increasing in temperature.

Materials suitable for use as second spectral filter 34 in this embodiment include silica glass and sapphire. If silica glass is used, the silica should contain low amounts of hydroxide ions so that the glass will be substantially transparent to thermal radiation at a wavelength of 2.7 microns. In particular, the silica glass should have a hydroxide concentration of less than about 10 ppm or, in other words, less than about 0.001% by weight.

In order to further improve the ability of the apparatus of the present invention to remove unwanted light from being detected by radiation sensing device 30 and in order to further prevent spectral filters contained within chamber 12 from increasing in temperature, the present invention is also directed to applying to the spectral filters specially designed reflective coatings. For instance, referring to FIG. 2, an enlarged view of first spectral filter 32 and second spectral filter 34 is illustrated. As shown, spectral filters 32 and 34 are positioned between lamps 24 and a semiconductor wafer 14.

In accordance with one alternative embodiment of the present invention, as shown, second spectral filter 34 includes a reflective coating A applied to a surface of the filter that is facing wafer 14. Coating A is designed to transmit or reflect thermal radiation being emitted by wafer 14 in order to prevent the thermal radiation from being absorbed by second spectral filter 34. Coating A, however, should also be transparent to thermal radiation being emitted by lamps 24 that is needed to heat wafer 14.

For example, if second spectral filter 34 is made from silica glass, it is known that silica glass absorbs thermal radiation having a wavelength of longer than about 4 microns. Should semiconductor wafer 14 emit thermal radiation at wavelengths greater than 4 microns, second spectral filter 34 will absorb such radiation, increase in temperature and may interfere with the heat treating process.

In order to accomplish the above-described purposes, coating A, for example, can be made from multiple layers of dielectric materials specially designed for the particular application. Such coatings are known in the art and can be commercially obtained from Deposition Sciences, Inc. of Santa Rosa, Calif. Such dielectric coatings are typically made from various dielectric materials including oxides and nitrides of various elements, such as silicon and germanium. For instance, a dielectric coating which provides substantially 100% reflectivity for radiation having a wavelength between about 4.5 and 5.5 microns is disclosed in U.S. Pat. No. 5,226,732 to Nakos, et al., which is incorporated herein by reference in its entirety.

Figure 2:
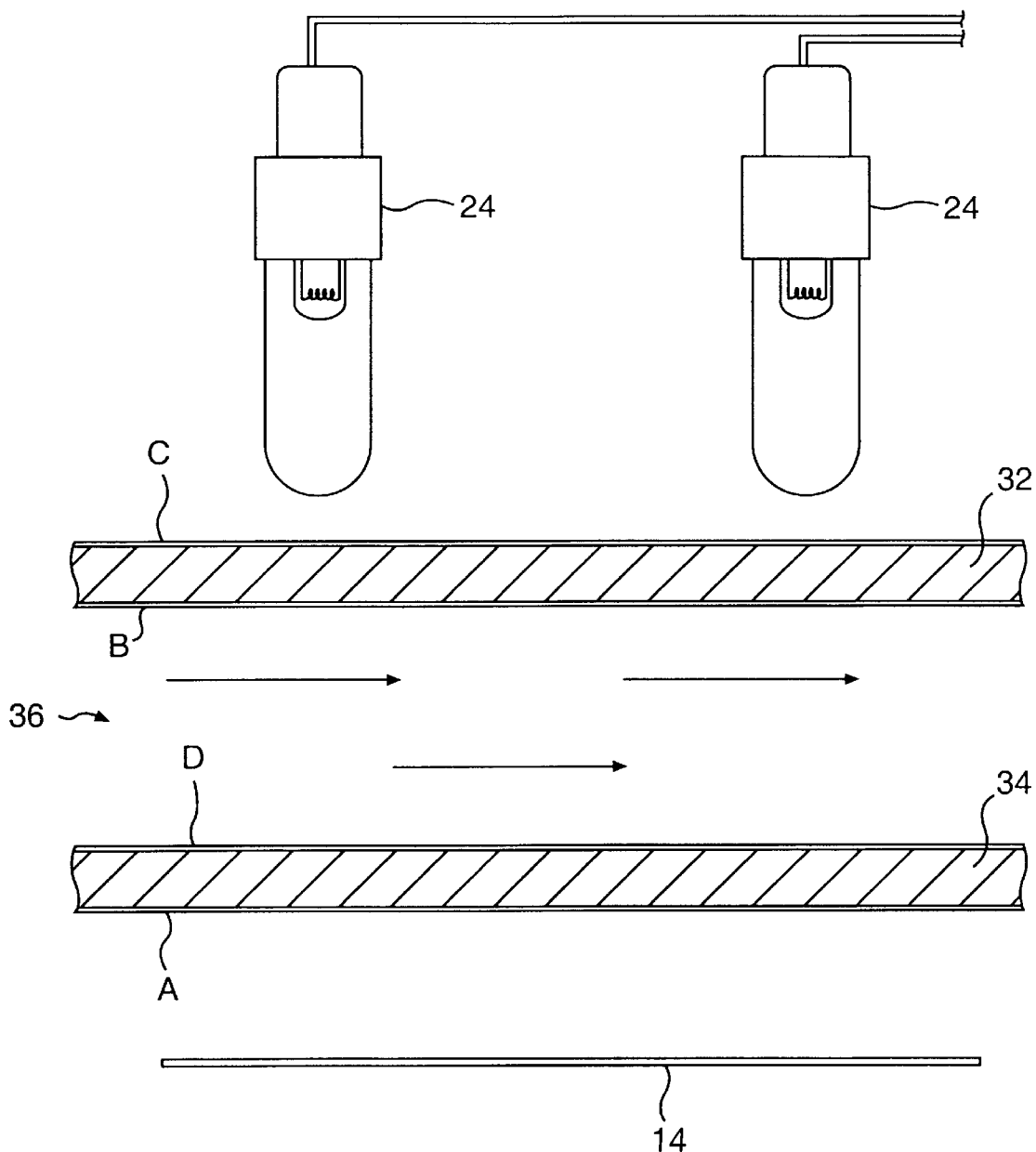
FIG. 2 is a side view with cut away portions of an enlarged portion of the apparatus illustrated in FIG. 1.

In accordance with the present invention, as shown in FIG. 2, a reflective coating B can also be applied to a surface of first spectral filter 32. Coating B is preferably designed so as to reflect thermal radiation at the wavelength of operation of the radiation sensing device 30 (for instance, at a wavelength of about 2.7 microns). Coating B, however, should be substantially transparent to thermal radiation needed to heat wafer 14.

As described above, during operation of apparatus 10, first spectral filter 32 substantially absorbs most thermal radiation being emitted by lamps 24 at the operating wavelength of radiation sensing device 30. As more thermal radiation is absorbed by spectral filter 32, the filter will increase in temperature and then may begin to remit thermal radiation at the operating wavelength, which may interfere with the operation of the radiation sensing device. Thus, coating B is designed to prevent remission of thermal energy by the spectral filter. Coating B has the effect of preventing unwanted thermal radiation from being emitted by spectral filter 32 and from being detected by radiation sensing device 30. Similar to coating A, coating B can also be made from dielectric materials.

As shown in FIG. 2, spectral filters 32 and 34 include two further reflective coatings C and D. Coatings C and D can be applied to spectral filters 32 and 34 in order to prevent the filters from increasing in temperature during operation of the thermal processing chamber. For instance, if spectral filters 32 and 34 are made from silica glass, as described above, the filters may absorb thermal radiation at a wavelength of greater than about 4 microns and increase in temperature. In order to prevent such thermal radiation from being absorbed by the filter windows, coatings C and D can be designed to reflect thermal radiation having a wavelength of greater than 4 microns. Such coatings would be similar in construction to coating A described above.

More particularly, coating C will reflect thermal radiation being emitted by lamps 24 for preventing first spectral filter 32 from being heated. Coating D, on the other hand, will reflect thermal radiation either being emitted by first spectral filter 32 or passing through spectral filter 32.

In summary, the coatings described above either reflect thermal radiation strongly in one wavelength band, or they reflect in a broad region in order to diminish the amount the spectral filters heat up during operation of the chamber. The coatings, however, should have efficient transmission of light needed to heat the wafer. It should be understood that each of coatings A, B, C and D described above may be used alone or in combination with the others. Further, it should also be understood that the coatings can be used in devices that only include a single spectral filter.

Figure 3:
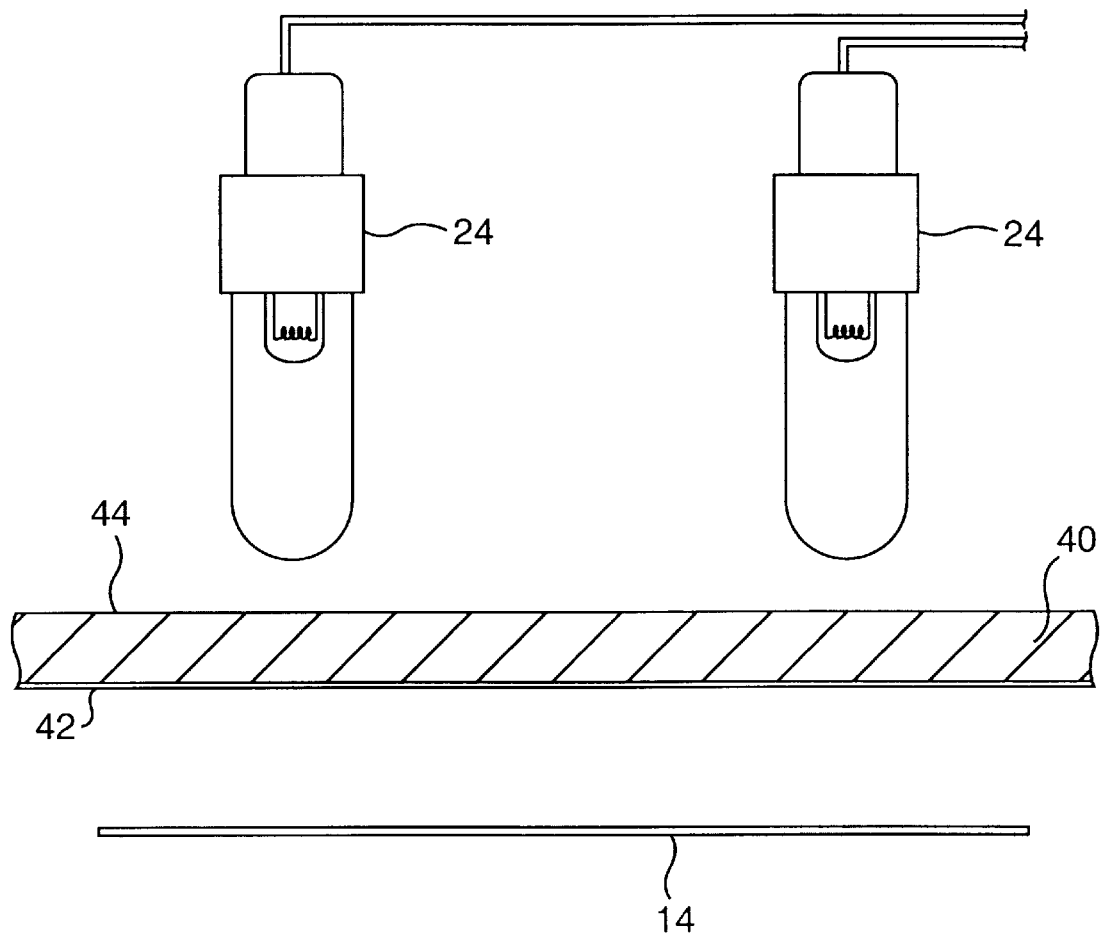
FIG. 3 is a side view with cut away portions of an alternative embodiment of an apparatus for heat treating semiconductor devices in accordance with the present invention.

For example, referring to FIG. 3, a further embodiment of the present invention is illustrated. In this embodiment, lamps 24 are separated from a semiconductor wafer 14 by a single spectral filter 40. Spectral filter 40 includes a reflective coating 42. In accordance with the present invention, reflective coating 42 can be used to either prevent unwanted thermal radiation from being detected by a radiation sensing device or can be used to prevent spectral filter 40 from heating up during operation of lamps 24.

For instance, in one embodiment, reflective coating 42 can be made similar to coating A described above. In this embodiment, reflective coating 42 will reflect thermal radiation being emitted by wafer 14 and prevent such thermal radiation from being absorbed by the spectral filter. In this manner, reflective coating 42 will prevent spectral filter 40 from increasing in temperature.

Alternatively, however, coating 42 can be made in accordance with coating B described above. In this embodiment, reflective coating 42 will prevent thermal radiation at the wavelength of operation of the radiation sensing device being emitted either by lamps 24 or by spectral filter 40 itself from being detected by the radiation sensing device.

In still a further alternative embodiment of the present invention, spectral filter 40 can include a second reflective coating applied to a surface 44, which is facing lamps 24. Such a coating would be designed similar to coatings C and D above and would be configured to reflect thermal radiation being emitted by lamps 24 that may be absorbed by spectral filter 40. For instance, if spectral filter 40 is made from silica glass, the second reflective coating could be made from dielectric materials that reflect thermal radiation at a wavelength of greater than about 4 microns.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only and, is not intended to limit the invention so further described in such appended claims.

What is claimed is:

1. An apparatus for heat treating semiconductor devices comprising:
  a thermal processing chamber adapted to contain a semiconductor wafer;
  a light source in communication with said thermal processing chamber, said light source comprising at least one lamp for emitting light energy into said chamber;
  at least one radiation sensing device extending into said thermal processing chamber, said at least one radiation sensing device being configured to sense thermal radiation at a preselected wavelength, said at least one radiation sensing device for sensing radiation being emitted by a semiconductor wafer contained within said chamber;
  a first spectral filter being positioned between said light source and said at least one radiation sensing device, said first spectral filter being configured to absorb thermal radiation being emitted by said light source at said preselected wavelength for preventing said thermal radiation from being detected by said at least one radiation sensing device; and
  a second spectral filter spaced apart from said first spectral filter so as to define a cooling channel therebetween, said second spectral filter being positioned between said first spectral filter and said at least one radiation sensing device, said second spectral filter being substantially transparent to thermal radiation at said preselected wavelength.

2. An apparatus as defined in claim 1, wherein said first spectral filter is made from silica having a hydroxide concentration of at least 0.1%.

3. An apparatus as defined in claim 2, wherein said at least one radiation sensing device senses thermal radiation at a wavelength of about 2.7 microns.

4. An apparatus as defined in claim 1, further comprising a cooling fluid conveying device for forcing a cooling fluid through said cooling channel.

5. An apparatus as defined in claim 4, wherein said cooling fluid conveying device is configured to force air through said cooling fluid channel.

6. An apparatus as defined in claim 4, wherein said cooling fluid is forced through said cooling fluid channel at a flow rate of at least 150 cubic feet per minute.

7. An apparatus as defined in claim 1, wherein said second spectral filter includes a first surface positioned so as to face a semiconductor wafer when said wafer is contained in said thermal processing chamber, said first surface being coated with a reflective coating, said coating reflecting thermal radiation being emitted by said semiconductor wafer at a wavelength of greater than about 4 microns for preventing said second spectral filter from increasing in temperature when said wafer is heated.

8. An apparatus as defined in claim 1, wherein said first spectral filter includes a first surface facing said second spectral filter, said first surface being coated with a reflective coating, said coating being configured to prevent thermal radiation at said preselected wavelength from being emitted by said first spectral filter towards said at least one radiation sensing device.

9. An apparatus for heat treating semiconductor devices comprising:
  a thermal processing chamber adapted to contain a semiconductor wafer;
  a light source in communication with said thermal processing chamber, said light source comprising at least one lamp for emitting light energy into said chamber;
  at least one radiation sensing device located within said thermal processing chamber, said at least one radiation sensing device being configured to sense thermal radiation at a preselected wavelength, said at least one radiation sensing device for sensing thermal radiation being emitted by a semiconductor wafer contained within said chamber; and
  a first spectral filter spaced apart from a second spectral filter so as to define a cooling fluid channel therebetween, said first and second spectral filters being positioned between said light source and said at least one radiation sensing device for preventing thermal radiation being emitted by said light source at said preselected wavelength from being detected by said at least one radiation sensing device, said first and second spectral filters being positioned such that light energy being emitted by said light source first passes through said first spectral filter and then passes through said second spectral filter, said first and second spectral filters being made of silica, said first spectral filter containing a greater concentration of hydroxide ions than said second spectral filter.

10. An apparatus as defined in claim 9, wherein said first spectral filter has a hydroxide concentration of greater than 0.1%.

11. An apparatus as defined in claim 9, further comprising a cooling fluid conveying device for forcing a cooling fluid through said cooling channel.

12. An apparatus as defined in claim 9, wherein said at least one radiation sensing device senses thermal radiation at a wavelength of about 2.7 microns.

13. An apparatus as defined in claim 9, wherein said at least one radiation sensing device comprises a pyrometer.

14. An apparatus as defined in claim 9, wherein said first spectral filter is made from a material comprising vitreous silica.

15. An apparatus as defined in claim 9, wherein said second spectral filter includes a first surface positioned so as to face a semiconductor wafer when contained in said thermal processing chamber, said first surface being coated with a reflective coating, said coating being made from a dielectric material, said coating reflecting thermal radiation being emitted by said semiconductor wafer at a wavelength of greater than about 4 microns for preventing said second spectral filter from increasing in temperature when said wafer is heated.

16. An apparatus as defined in claim 9, wherein said first spectral filter includes a first surface facing said light source and a second surface facing said second spectral filter, said second surface being coated with a reflective coating, said coating being made from a dielectric material, said coating being configured to prevent thermal radiation at a wavelength of about 2.7 microns from being emitted by said first spectral filter towards said at least one radiation sensing device.

17. An apparatus as defined in claim 10, wherein said second spectral filter has a hydroxide concentration of no more than 0.001%.

18. An apparatus for heat treating semiconductor devices comprising:
   a thermal processing chamber adapted to contain a semiconductor wafer;
   a light source in communication with said thermal processing chamber, said light source comprising at least one lamp for emitting light energy into said chamber;
   at least one radiation sensing device located within said thermal processing chamber, said at least one radiation sensing device for sensing thermal radiation at a preselected wavelength, said at least one radiation sensing device for sensing thermal radiation being emitted by a semiconductor wafer contained within said chamber; and
   a spectral filter positioned between said light source and said at least one radiation sensing device, said spectral filter being configured to substantially prevent thermal radiation being emitted by said light source at said preselected wavelength from being detected by said at least one radiation sensing device, said spectral filter including a first outer surface facing said at least one radiation sensing device, said first outer surface being coated with a reflective coating, said reflective coating being configured to reflect thermal radiation at a wavelength range different than the preselected wavelength at which said radiation sensing device operates, said wavelength range being greater than about 4 microns, said reflective coating reflecting thermal radiation being emitted by a semiconductor wafer contained in said thermal processing chamber for preventing said spectral filter from absorbing said thermal radiation and increasing in temperature.

19. An apparatus as defined in claim 18, wherein said reflective coating is made from a dielectric material.

20. An apparatus as defined in claim 18, wherein said spectral filter comprises a first filter window spaced apart from a second filter window so as to define a cooling fluid channel therebetween, said first and second filter windows being made from fused silica, said first and second filter windows being positioned such that light energy being emitted by said light source first passes through said first filter window and then through said second filter window, said first filter window containing a greater concentration of hydroxide ions than said second filter window.

21. An apparatus as defined in claim 20, further comprising a cooling fluid conveying device for forcing a cooling fluid through said cooling channel.

22. An apparatus as defined in claim 20, wherein said first filter window defines a first inner surface facing said second filter window, said first inner surface being coated with a second reflective coating, said second reflective coating being made from a dielectric material, said second reflective coating being configured to prevent thermal radiation at said preselected wavelength from being emitted by said first filter window.

23. An apparatus as defined in claim 20, wherein said spectral filter further includes a second outer surface facing said light source, said second outer surface being coated with a third reflective coating, said third reflective coating being made from a dielectric material, said third reflective coating being configured to reflect thermal radiation at a wavelength of greater than about 4 microns in order to prevent said first filter window from increasing in temperature due to thermal radiation being emitted by said light source.

24. An apparatus as defined in claim 20, wherein said second filter window defines a second inner surface facing said first filter window, said second inner surface being coated with a fourth reflective coating, said fourth reflective coating being made from a dielectric material, said fourth reflective coating being configured to reflect thermal radiation at a wavelength of greater than about 4 microns.

25. An apparatus as defined in claim 20, wherein said preselected wavelength is about 2.7 microns.

26. An apparatus for heat treating semiconductor devices comprising:
   a thermal processing chamber adapted to contain a semiconductor wafer;
   a light source in communication with said thermal processing chamber, said light source comprising at least one lamp for emitting light energy into said chamber;
   at least one radiation sensing device located within said processing chamber, said at least one radiation sensing device for sensing thermal radiation at a preselected wavelength, said at least one radiation sensing device for sensing thermal radiation being emitted by a semiconductor wafer contained within said chamber; and
   a spectral filter positioned between said light source and said at least one radiation sensing device, said spectral filter being configured to substantially prevent thermal radiation being emitted by said light source at said preselected wavelength from being detected by said at least one radiation sensing device, said spectral filter including a first surface facing said light source and a second surface facing said at least one radiation sensing device, said first surface being coated with a first reflective coating, said first reflective coating being configured to reflect thermal radiation at a wavelength greater than about 4 microns in order to prevent said spectral filter from increasing in temperature, said second surface being coated with a second reflective coating, said second reflective coating being configured to prevent thermal radiation at said preselected wavelength from being emitted by said spectral filter towards said at least one radiation sensing device.

27. An apparatus as defined in claim 26, wherein said preselected wavelength is about 2.7 microns.

28. An apparatus as defined in claim 26, wherein said first reflective coating and said second reflective coating are made from dielectric materials.

29. An apparatus as defined in claim 26, wherein said spectral filter comprises silica.

30. An apparatus as defined in claim 26, wherein said spectral filter comprises silica having a hydroxide concentration of at least 0.1%.

* * * * *